US011571706B2

(12) United States Patent
Miyazaki et al.

(10) Patent No.: US 11,571,706 B2
(45) Date of Patent: Feb. 7, 2023

(54) DROPLET EJECTING APPARATUS HAVING CARRIAGE MARKS, DROPLET EJECTING METHOD, AND COMPUTER STORAGE MEDIUM

(71) Applicant: Tokyo Electron Limited, Tokyo (JP)

(72) Inventors: Fumihiro Miyazaki, Kumamoto (JP); Kazuhito Miyazaki, Kumamoto (JP); Norihide Sagara, Kumamoto (JP); Wataru Yoshitomi, Kumamoto (JP); Koutarou Onoue, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 231 days.

(21) Appl. No.: 15/905,977

(22) Filed: Feb. 27, 2018

(65) Prior Publication Data
US 2018/0257099 A1    Sep. 13, 2018

(30) Foreign Application Priority Data
Mar. 7, 2017 (JP) .............................. JP2017-042756

(51) Int. Cl.
*H01L 21/67* (2006.01)
*B41J 2/045* (2006.01)
(Continued)

(52) U.S. Cl.
CPC ........ *B05C 5/0208* (2013.01); *B05C 11/1015* (2013.01); *B05C 13/00* (2013.01);
(Continued)

(58) Field of Classification Search
CPC ...... B41J 11/46; B41J 29/393; B41J 2/04505; B41J 25/001; B05B 12/124; B05C 11/1015; H01L 21/67259; H01L 21/681
See application file for complete search history.

(56) References Cited

U.S. PATENT DOCUMENTS 5,847,722 A * 12/1998 Hackleman ............ B41J 2/1753
347/19
6,260,951 B1 * 7/2001 Harvey .................... B41J 2/155
347/49
(Continued)

FOREIGN PATENT DOCUMENTS

CN    1939731 A    4/2007
CN    101337459 A    1/2009
(Continued)

OTHER PUBLICATIONS

U.S. Appl. No. 62/459,402, filed Feb. 2017, Darrow.*

*Primary Examiner* — Karl Kurple
(74) *Attorney, Agent, or Firm* — Venjuris, P.C.

(57) ABSTRACT

A droplet ejecting apparatus includes a workpiece table configured to place a workpiece thereon, a droplet ejecting head configured to eject droplets onto the workpiece placed on the workpiece table, a Y-axis linear motor configured to move the workpiece table in a main scanning direction (Y-axis direction), a position detector configured to detect a position of a carriage mark, and a control unit configured to calculate the positional deviation amount in the main scanning direction between a detection position detected by the position detector and a reference position of the carriage mark and correct a droplet ejecting timing of the droplet ejecting head based on the positional deviation amount.

11 Claims, 13 Drawing Sheets

(51) Int. Cl.
*B41J 25/00* (2006.01)
*H01L 51/00* (2006.01)
*H01L 21/68* (2006.01)
*B41J 29/393* (2006.01)
*H04N 1/00* (2006.01)
*B05C 5/02* (2006.01)
*B05C 13/00* (2006.01)
*B05C 11/10* (2006.01)
*B05D 1/26* (2006.01)
*B05B 12/08* (2006.01)

(52) U.S. Cl.
CPC ......... *B41J 2/04505* (2013.01); *B41J 29/393* (2013.01); *H01L 21/6715* (2013.01); *H01L 21/67259* (2013.01); *H01L 21/681* (2013.01); *H01L 51/0005* (2013.01); *H04N 1/00761* (2013.01); *B05B 12/084* (2013.01); *B41J 25/001* (2013.01); *B41J 2202/09* (2013.01); *B41J 2203/01* (2020.08)

(56) References Cited

U.S. PATENT DOCUMENTS

| | | | | |
|---|---|---|---|---|
| 6,623,096 | B1 * | 9/2003 | Castano | B41J 2/2135 347/19 |
| 7,217,438 | B2 * | 5/2007 | Newsome | B41J 25/001 347/107 |
| 7,556,334 | B2 * | 7/2009 | White | B41J 2/04505 118/313 |
| 7,602,490 | B2 * | 10/2009 | Inaoka | B41J 2/161 356/399 |
| 9,387,562 | B2 * | 7/2016 | Yoshikawa | B41J 29/02 |
| 9,643,405 | B1 * | 5/2017 | Calamita | B41J 11/008 |
| 2006/0054039 | A1 * | 3/2006 | Kritchman | B29C 48/92 101/424.1 |
| 2006/0092199 | A1 * | 5/2006 | White | B41J 2/0459 347/9 |
| 2007/0070107 | A1 * | 3/2007 | Shamoun | B41J 29/393 347/14 |
| 2007/0070109 | A1 * | 3/2007 | White | B41J 29/393 347/19 |
| 2009/0231368 | A1 * | 9/2009 | Nakano | B41J 2/175 347/8 |
| 2009/0267975 | A1 * | 10/2009 | White | B41J 2/04588 347/2 |
| 2010/0103214 | A1 * | 4/2010 | Seo | B41J 29/393 347/14 |
| 2010/0238229 | A1 * | 9/2010 | Ito | B41J 29/38 347/19 |
| 2011/0273504 | A1 * | 11/2011 | Boesten | B41J 2/2128 347/14 |
| 2015/0209922 | A1 * | 7/2015 | Yoshikawa | B41J 29/393 29/890.1 |
| 2015/0298153 | A1 * | 10/2015 | Baker | B41J 2/04588 438/7 |
| 2018/0014410 | A1 * | 1/2018 | Darrow | B41J 29/393 |
| 2019/0297733 | A1 * | 9/2019 | Darrow | B41J 29/393 |

FOREIGN PATENT DOCUMENTS

| | | |
|---|---|---|
| CN | 101518995 A | 9/2009 |
| CN | 101823363 A | 9/2010 |
| JP | 2010-198028 A | 9/2010 |
| JP | 2015-074149 A | 4/2015 |

\* cited by examiner

DROPLET EJECTING APPARATUS HAVING CARRIAGE MARKS, DROPLET EJECTING METHOD, AND COMPUTER STORAGE MEDIUM

CROSS-REFERENCE TO RELATED APPLICATIONS

This application is based on and claims priority from Japanese Patent Application No. 2017-042756, filed on Mar. 7, 2017, with the Japan Patent Office, the disclosure of which is incorporated herein in its entirety by reference.

TECHNICAL FIELD

The present disclosure relates to a droplet ejecting apparatus which ejects the droplets of a functional liquid onto a workpiece so as to draw a pattern, a droplet ejecting method using the droplet ejecting apparatus, a program, and a computer storage medium.

BACKGROUND

In the related art, as an apparatus for drawing a pattern on a workpiece using a functional liquid, there has been known an inkjet type droplet ejecting apparatus which ejects the droplets of the functional liquid. The droplet ejecting apparatus is widely used, for example, when manufacturing electro-optical devices (flat panel displays (FPD)) such as organic EL devices, color filters, liquid crystal display devices, plasma displays (PDP devices), and electron emitting devices (field emission display (FED) devices or surface-condition electron-emitter display (SED) devices).

For example, a droplet ejecting apparatus disclosed in Japanese Patent Application Laid-Open No. 2010-198028 includes a functional liquid droplet ejecting head (droplet ejecting head) which ejects the droplets of a functional liquid, a workpiece stage (workpiece table) on which a workpiece is mounted, and a movement mechanism (linear motor) which moves the workpiece table in a direction in which a pair of support bases for guidance extends (main scanning direction). Further, the droplet ejecting apparatus draws a pattern on the workpiece by ejecting the functional liquid from the droplet ejecting head into a bank formed in advance on the workpiece while moving the workpiece relative to the droplet ejecting head using the workpiece table.

During the drawing operation of the droplet ejecting apparatus, the workpiece is reciprocally moved relative to the droplet ejecting head in the main scanning direction and appropriately moved in a sub-scanning direction orthogonal to the main scanning direction. With this drawing operation, patterns are drawn on an overall surface of the workpiece.

SUMMARY

To achieve the aforementioned object, the present disclosure provides a droplet ejecting apparatus which ejects droplets of a functional liquid droplet onto a workpiece so as to draw a pattern. The droplet ejecting apparatus includes: a workpiece table configured to place the workpiece thereon; a droplet ejecting head configured to eject the droplet onto the workpiece placed on the workpiece table; a workpiece movement mechanism configured to relatively move the workpiece table and the droplet ejecting head in a main scanning direction; a position detector configured to detect a position of the droplet ejecting head; and a control unit configured to: calculate a positional deviation amount in the main scanning direction between a detection position detected by the position detector and a reference position of the droplet ejecting head; and correct a droplet ejecting timing of the droplet ejecting head based on the positional deviation amount.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENT

Figure 1:
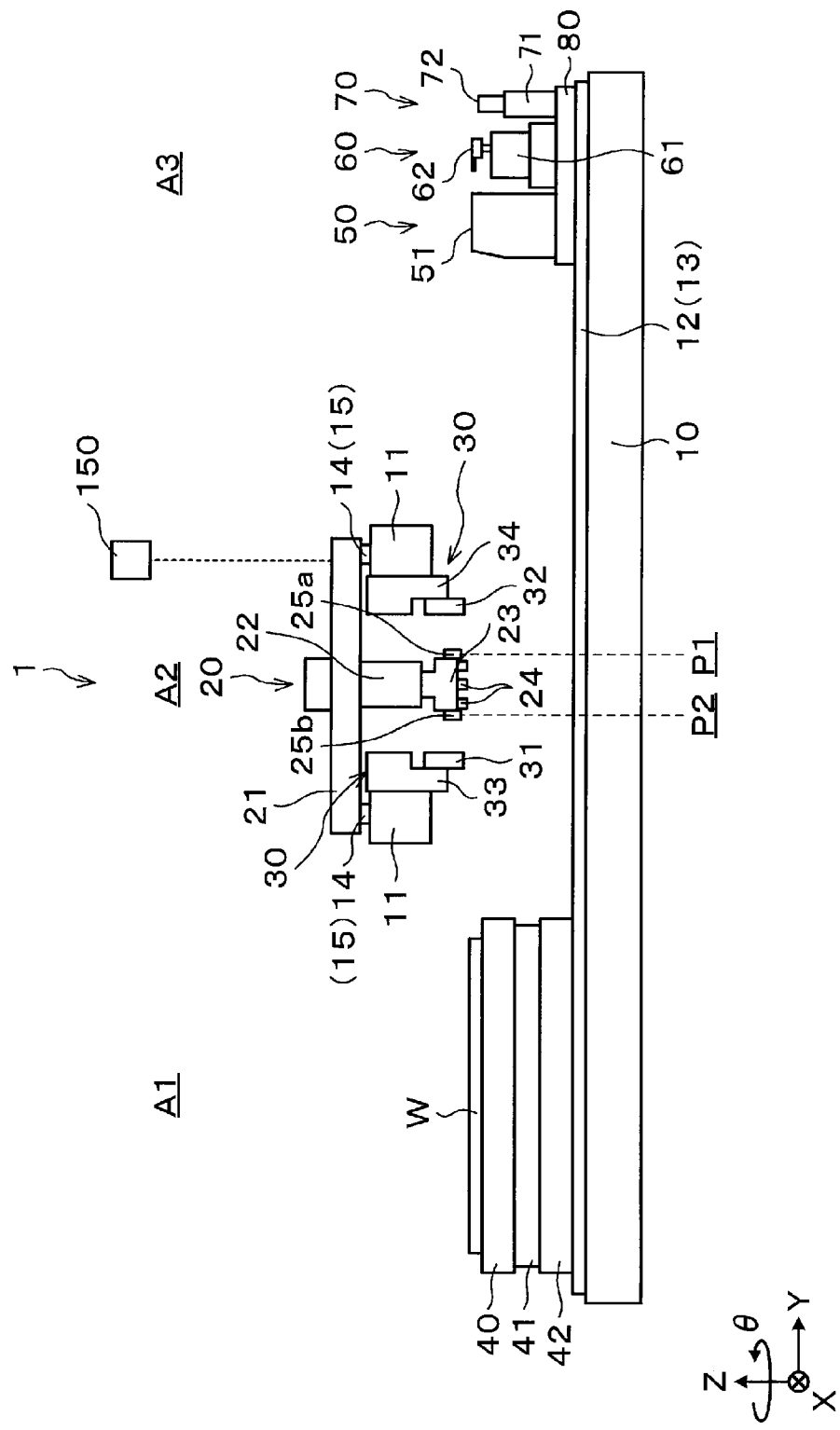
FIG. 1 is a side view illustrating an outline of a configuration of a droplet ejecting apparatus according to the present exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the case of the aforementioned droplet ejecting apparatus, a landing position when a droplet ejected from the droplet ejecting head lands on the workpiece is adjusted when the droplet ejecting apparatus starts up. Specifically, a droplet lands on a position adjustment workpiece, a landing position of the droplet is measured, and the positional deviation amount between the measured landing position and a target position is calculated. Further, based on the positional deviation amount, for example, a droplet ejecting timing of the droplet ejecting head is corrected, and a relative movement of the workpiece table and the droplet ejecting head in the main scanning direction and the sub-scanning direction is corrected.

However, after the landing position is adjusted when the droplet ejecting apparatus starts up, a positional relationship between the droplet ejecting head and the bank on the workpiece is changed in some instances due to factors such as, for example, a change in temperature or a change with time of each of the members of the droplet ejecting apparatus, for example, a carriage including the plurality of droplet ejecting heads. In this instance, the landing position of the droplet on the workpiece deviates.

Recently, large and high-definition (e.g., 4K or 8K) products have become mainstream in the products such as televisions manufactured using droplet ejecting apparatuses, and the droplet ejecting apparatus are also enlarged as the sizes of the workpieces are enlarged. For this reason, the positional deviation between the droplet ejecting head and the bank due to the aforementioned factors, that is, the positional deviation which occurs while the droplets ejected from the droplet ejecting head land on the bank on the workpiece cannot be ignored. Furthermore, due to the influence of a pixel size, the tolerance range of the positional deviation is also decreased to, for example, ±2 μm or less.

Therefore, in an apparatus requiring precision control like the droplet ejecting apparatus, there is a demand for a technology of correcting the landing position which is capable of robustly coping with a change in environment. However, at present, the landing position cannot be appropriately corrected in such a droplet ejecting apparatus.

The present disclosure has been made in consideration of the aforementioned situations, and an object of the present disclosure is to improve landing precision of a droplet on a workpiece from a droplet ejecting head in a droplet ejecting apparatus that ejects the droplets of a functional liquid onto a workpiece so as to draw a pattern.

To achieve the aforementioned object, the present disclosure provides a droplet ejecting apparatus that ejects droplets of a functional liquid to a workpiece so as to draw a pattern. The droplet ejecting apparatus includes: a workpiece table configured to place the workpiece thereon; a droplet ejecting head configured to eject the droplet onto the workpiece placed on the workpiece table; a workpiece movement mechanism configured to relatively move the workpiece table and the droplet ejecting head in a main scanning direction; a position detector configured to detect a position of the droplet ejecting head; and a control unit configured to: calculate a positional deviation amount in the main scanning direction between a detection position detected by the position detector and a reference position of the droplet ejecting head; and correct a droplet ejecting timing of the droplet ejecting head based on the positional deviation amount.

According to the present disclosure, it is possible to improve landing precision of the droplets from the droplet ejecting head onto a workpiece even if a positional relationship between the droplet ejecting head and the workpiece is changed due to factors such as a change in temperature or a change with time of each of the members of the droplet ejecting apparatus.

Hereinafter, exemplary embodiments of the present disclosure will be described with reference to the accompanying drawings. Meanwhile, the present disclosure is not limited by the exemplary embodiments disclosed below.

<Configuration of Droplet Ejecting Apparatus>

Figure 2:
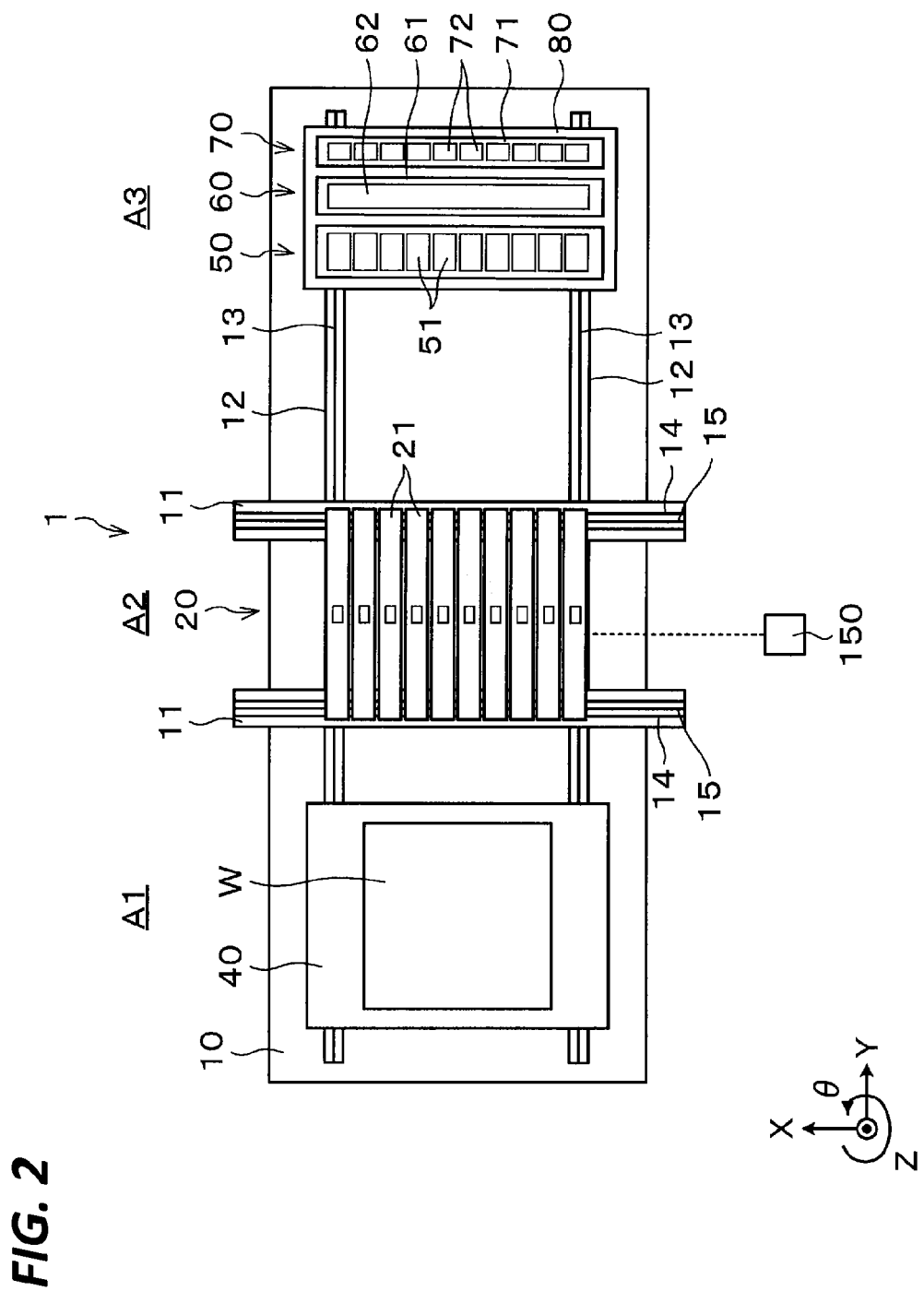
FIG. 2 is a top plan view illustrating an outline of the configuration of the droplet ejecting apparatus according to the present exemplary embodiment.

First, a configuration of a droplet ejecting apparatus according to the present exemplary embodiment will be described with reference to FIGS. 1 and 2. FIG. 1 is a side view illustrating an outline of a configuration of a droplet ejecting apparatus 1. FIG. 2 is a top plan view illustrating an outline of the configuration of the droplet ejecting apparatus 1. Further, hereinafter, a main scanning direction of a workpiece W is defined as a Y-axis direction, a sub-scanning direction orthogonal to the main scanning direction is defined as an X-axis direction, a vertical direction orthogonal to the Y-axis direction and the X-axis direction is defined as a Z-axis direction, and a rotation direction about the Z-axis is defined as a θ direction.

The droplet ejecting apparatus 1 has a Y-axis stage 10 extending in the main scanning direction (Y-axis direction) and moving the workpiece W in the main scanning direction, and a pair of X-axis stages 11 and 11 crossing over the Y-axis stage 10 and extending in the sub-scanning direction (X-axis direction). A pair of Y-axis guide rails 12 and 12 is provided to extend in the Y-axis direction on the upper surface of the Y-axis stage 10, and Y-axis linear motors 13 and 13 are provided on the Y-axis guide rails 12 and 12, respectively. X-axis guide rails 14 and 14 are provided to extend in the X-axis direction on upper surfaces of the X-axis stages 11 and 11, respectively, and X-axis linear motors 15 and 15 are provided on the X-axis guide rails 14 and 14, respectively. Further, in the following description, on the Y-axis stage 10, a negative side area with respect to the X-axis stages 11 in a Y-axis direction is defined as a loading and unloading area A1, an area between the pair of X-axis stages 11 and 11 is defined as a processing area A2, and a positive side area with respect to the X-axis stages 11 in a Y-axis direction is defined as a standby area A3.

Carriage units 20 and first image capturing sections 30 are provided on the pair of X-axis stages 11 and 11. A workpiece table 40, a flushing unit 50, an ejecting inspection unit 60, and a second image capturing section 70 are provided on the Y-axis stage 10. The workpiece table 40, the flushing unit 50, the ejecting inspection unit 60, and the second image capturing section 70 are placed in this order in the Y-axis direction.

A plurality of (e.g., ten) carriage units 20 are provided on the X-axis stages 11. Each of the carriage units 20 has a carriage plate 21, a carriage holding mechanism 22, and a carriage 23. The carriage holding mechanism 22 is provided at a center of a lower side of the carriage plate 21, and the carriage 23 is detachably mounted at a lower end of the carriage holding mechanism 22.

The carriage plate 21 is mounted on the X-axis guide rails 14 and may be moved by the X-axis linear motors 15 in the X-axis direction. Further, the plurality of carriage plates 21 may be integrally moved in the X-axis direction.

A motor (not illustrated) is mounted on the carriage 23. The carriage 23 is configured to be movable in the X-axis direction and the θ direction by the motor. Further, a droplet ejecting head 24, which is provided on the carriage 23 and will be described below, may also be moved in the X-axis direction and the θ direction. In the present exemplary embodiment, the carriage 23 constitutes a head movement mechanism of the present disclosure. Further, the movement of the carriage 23 (droplet ejecting head 24) in the X-axis direction and the θ direction may be performed by, for example, the carriage holding mechanism 22.

Figure 3:
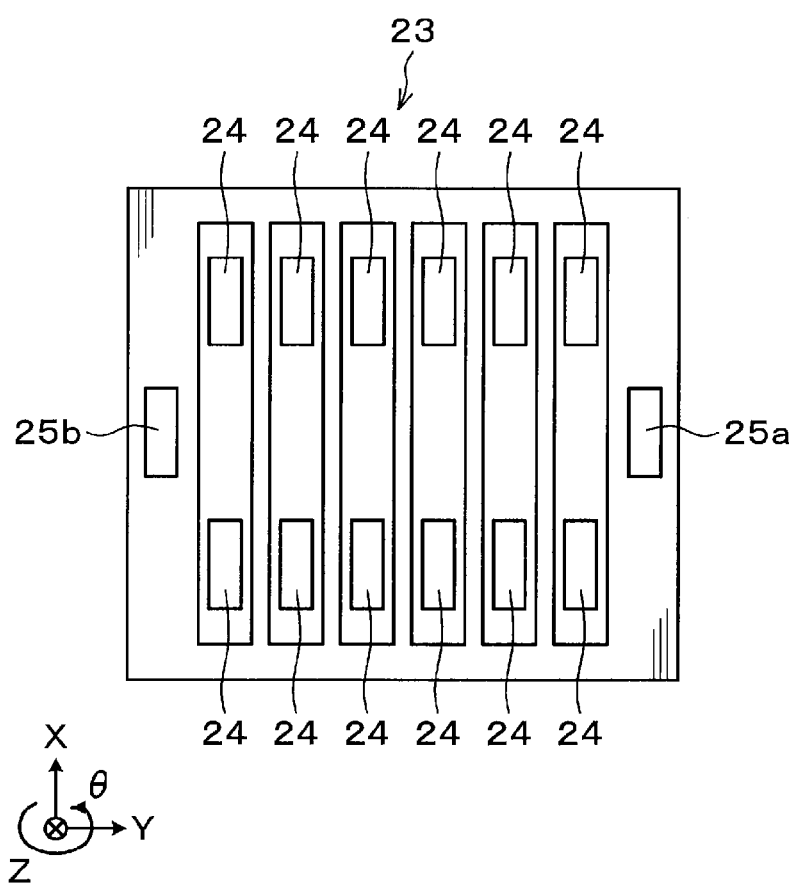
FIG. 3 is a top plan view illustrating an outline of a configuration of a carriage.

As illustrated in FIG. 3, a plurality of droplet ejecting heads 24 are arranged side by side in the Y-axis direction and the X-axis direction at a lower side of the carriage 23. In the present exemplary embodiment, for example, the six droplet ejecting heads 24 are provided in the Y-axis direction, and the two droplet ejecting heads 24 are provided in the X-axis direction, that is, the total of twelve droplet ejecting heads 24 are provided. A plurality of ejecting nozzles (not illustrated) are disposed in the lower surface, that is, the nozzle surface of each droplet ejecting head 24. Further, droplets of a functional liquid are ejected from the ejecting nozzles to droplet ejecting positions directly under the droplet ejecting head 24.

Carriage alignment marks 25 (hereinafter, referred to as "carriage marks 25") as reference marks are disposed on the lower surface of the carriage 23 at opposite sides of the plurality of droplet ejecting heads 24 (at the positive side in the Y-axis direction and the negative side in the Y-axis direction). The carriage marks 25 are marks that serve as criteria when the plurality of droplet ejecting heads 24 are assembled to the carriage 23, and the carriage marks 25 define the absolute reference position of the carriage 23. In the following description, the carriage mark 25 at the positive side of the droplet ejecting head 24 in the Y-axis direction is defined as a first carriage mark 25a, and the carriage mark 25 at the negative side of the droplet ejecting head 24 in the Y-axis direction is defined as a second carriage mark 25b.

As illustrated in FIGS. 1 and 2, the first image capturing sections 30 include a first image capturing unit 31 and a second image capturing unit 32 which are provided to face each other in the Y-axis direction with the carriage 23 (droplet ejecting head 24) interposed therebetween. For example, a CCD camera is used as the first image capturing unit 31 and the second image capturing unit 32, and the first image capturing unit 31 and the second image capturing unit 32 may capture images of the workpiece W placed on the workpiece table 40 even while the workpiece table 40 is being moved or stopped or workpiece processing (ejecting of droplets) is performed. The first image capturing unit 31 is disposed at the negative side in the Y-axis direction with respect to the carriage 23, and the second image capturing unit 32 is disposed at the positive side in the Y-axis direction with respect to the carriage 23. Further, the first image capturing sections 30 may be configured to be movable in the X-axis direction.

The first image capturing unit 31 is supported on a base 33 provided at a side of the X-axis stage 11 of the pair of X-axis stages 11 and 11 which is provided at the negative side in the Y-axis direction. Further, when the workpiece table 40 is guided to a position directly under the first image capturing unit 31, the first image capturing unit 31 captures an image of the workpiece W placed on the workpiece table 40.

The second image capturing unit 32 is supported on a base 34 provided at a side of the X-axis stage 11 of the pair of X-axis stages 11 and 11 which is provided at the positive side in the Y-axis direction. Further, when the workpiece table 40 is guided to a position directly under the second image capturing unit 32, the second image capturing unit 32 captures an image of the workpiece W placed on the workpiece table 40.

The workpiece table 40 is, for example, a vacuum suction table, and is configured to mount the workpiece W thereon by holding the workpiece W by suction. The workpiece table 40 is supported by a table movement mechanism 41 provided at a lower side of the workpiece table 40 so that the workpiece table 40 is movable in the X-axis direction and rotatable in the θ direction. The workpiece table 40 and the table movement mechanism 41 are supported on a first Y-axis slider 42 provided at a lower side of the table movement mechanism 41. The first Y-axis slider 42 is mounted on the Y-axis guide rails 12 and configured to be movable in the Y-axis direction by the Y-axis linear motors 13. Therefore, the workpiece table 40 is moved by the first Y-axis slider 42 in the Y-axis direction along the Y-axis guide rails 12 in a state in which the workpiece W is placed on the workpiece table 40 such that the workpiece W may be moved in the Y-axis direction. Further, in the present exemplary embodiment, the Y-axis linear motors 13 (first Y-axis slider 42) and the table movement mechanism 41 constitute a workpiece movement mechanism of the present disclosure. In addition, in the present exemplary embodiment, the table movement mechanism 41 is configured to move the workpiece table 40 in the X-axis direction and rotate the workpiece table 40 in the θ direction, but a mechanism for moving the workpiece table 40 in the X-axis direction and a mechanism for rotating the workpiece table 40 in the θ direction may be separately provided.

A workpiece alignment camera (not illustrated is provided above the workpiece table 40 in the loading and unloading area A1) so as to capture an image of the workpiece W placed on the workpiece table 40. Further, based on the image captured by the workpiece alignment camera, the position in the Y-axis direction, the position in the X-axis direction, and the position in the θ direction of the workpiece W placed on the workpiece table 40 are corrected by the first Y-axis slider 42 and the table movement mechanism 41, as necessary. Therefore, the workpiece W is aligned such that a predetermined initial position of the workpiece W is set.

The flushing unit 50 is a unit that receives a discarded droplet from the droplet ejecting head 24. The flushing unit 50 is provided with a plurality of (e.g., ten) flushing recovery tables 51 provided side by side in the X-axis direction. The number of flushing recovery tables 51 is equal to the number of carriages 23, and a pitch of the flushing recovery tables 51 is also equal to a pitch of the carriages 23.

The flushing recovery table 51 is opened at an upper side thereof, and when the flushing recovery table 51 is guided to a position directly under the corresponding carriage 23, the droplets are ejected (flushed) from the droplet ejecting head 24 of the carriage 23, and the flushing recovery table 51 receives and accommodates the droplets. That is, the flushing operation is performed before a pattern is drawn on the workpiece W using the droplets, and the droplets based on the flushing operation are recovered by the flushing recovery table 51.

The ejecting inspection unit 60 is a unit that inspects the droplets ejected from the droplet ejecting head 24. The ejecting inspection unit 60 is provided with an inspection table 61 which extends in the X-axis direction. An inspection sheet 62, which has a surface coated with a film, is disposed on an upper surface of the inspection table 61. The inspection sheet 62 disposed on the inspection table 61 is configured such that the droplets ejected from the droplet ejecting head 24 lands on the inspection sheet 62 when the inspection table 61 is guided to a position directly under the droplet ejecting head 24.

The second image capturing section 70 is provided with a base 71 which extends in the X-axis direction. A plurality of (e.g., ten) position detectors 72 are provided side by side in the X-axis direction on an upper surface of the base 71. The number of position detectors 72 is equal to the number of carriages 23, and a pitch of the position detectors 72 is also equal to a pitch of the carriages 23.

The position detector 72 is provided with, for example, a CCD camera, and when the position detector 72 is guided to a position directly under the carriage 23, the position detector 72 captures an image of the carriage mark 25 of the carriage 23. In addition, based on the captured image acquired by the CCD camera, the position detector 72 detects a position of the carriage mark 25 (i.e., a position of the droplet ejecting head 24).

The flushing unit 50, the ejecting inspection unit 60, and the second image capturing section 70 are supported on a second Y-axis slider 80. The second Y-axis slider 80 is mounted on the Y-axis guide rails 12 and configured to be movable in the Y-axis direction by the Y-axis linear motors 13. Therefore, the flushing unit 50, the ejecting inspection unit 60, and the second image capturing section 70 may also be moved by the second Y-axis slider 80 in the Y-axis direction along the Y-axis guide rails 12.

In the present exemplary embodiment, the flushing unit 50 and the ejecting inspection unit 60 constitute a maintenance unit of the present disclosure. In addition, in the present exemplary embodiment, the Y-axis linear motors 13 (second Y-axis slider 80) constitute a unit movement mechanism of the present disclosure.

<Control Unit>

The droplet ejecting apparatus 1 is provided with a control unit 150. The control unit 150 is, for example, a computer and has a data storing unit (not illustrated). For example, the data storing unit stores drawing data (bitmap data) for drawing a predetermined pattern on the workpiece W by controlling the droplets being ejected onto the workpiece W. In addition, the control unit 150 has a program storing unit (not illustrated). The program storing unit stores a program for controlling various types of processing in the droplet ejecting apparatus 1.

The data or the program are recorded in, for example, a computer-readable storage medium such as a computer-readable hard disk (HD), a flexible disk (FD), a compact disk (CD), a magneto-optical disk (MO), and a memory card, and may be installed in the control unit 150 from the storage medium.

In the present exemplary embodiment, based on the detection positions of the carriage marks 25a and 25b detected by the position detectors 72 and the positional deviation amount of the reference positions of the carriage marks 25a and 25b, the control unit 150 corrects the droplet ejecting timing of the droplet ejecting head 24, and corrects the positions of the carriage 23 (droplet ejecting head 24) in the X-axis direction and the θ direction. Specifically, the following steps S1 to S3 are performed.

The position detector 72 is positioned directly under the first carriage mark 25a and captures an image of the first carriage mark 25a, and the position of the position detector 72 in this case is defined as a first image capturing position P1. Further, the position detector 72 is positioned directly under the second carriage mark 25b and captures an image of the second carriage mark 25b, and the position of the position detector 72 in this case is defined as a second image capturing position P2.

Figure 4:
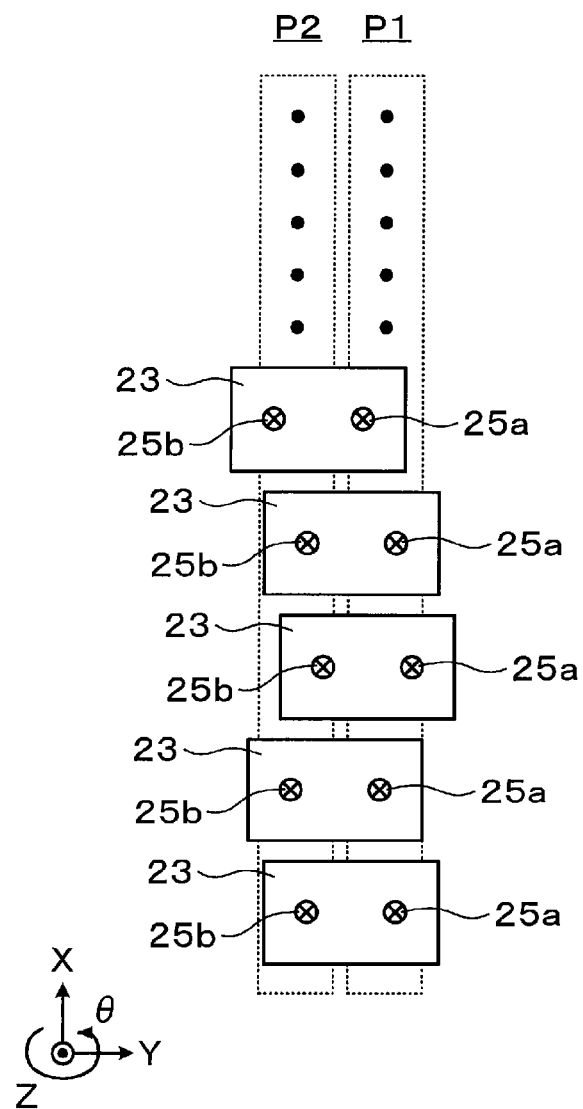
FIG. 4 is an explanatory view illustrating a reference position of the carriage.

First, the reference positions of the carriage marks 25a and 25b are acquired (step S1). As illustrated in FIG. 4, the positions of the plurality of carriages 23 deviate due to an assembling error when the carriages 23 are assembled to the droplet ejecting apparatus 1, and as a result, the positions of the carriage marks 25a and 25b of the plurality of carriages 23 also deviate. Therefore, the reference positions of the carriage marks 25a and 25b of the respective carriages 23 are acquired. Further, FIG. 4 illustrates five carriages 23 among ten carriages 23 for ease of description.

Figure 5:
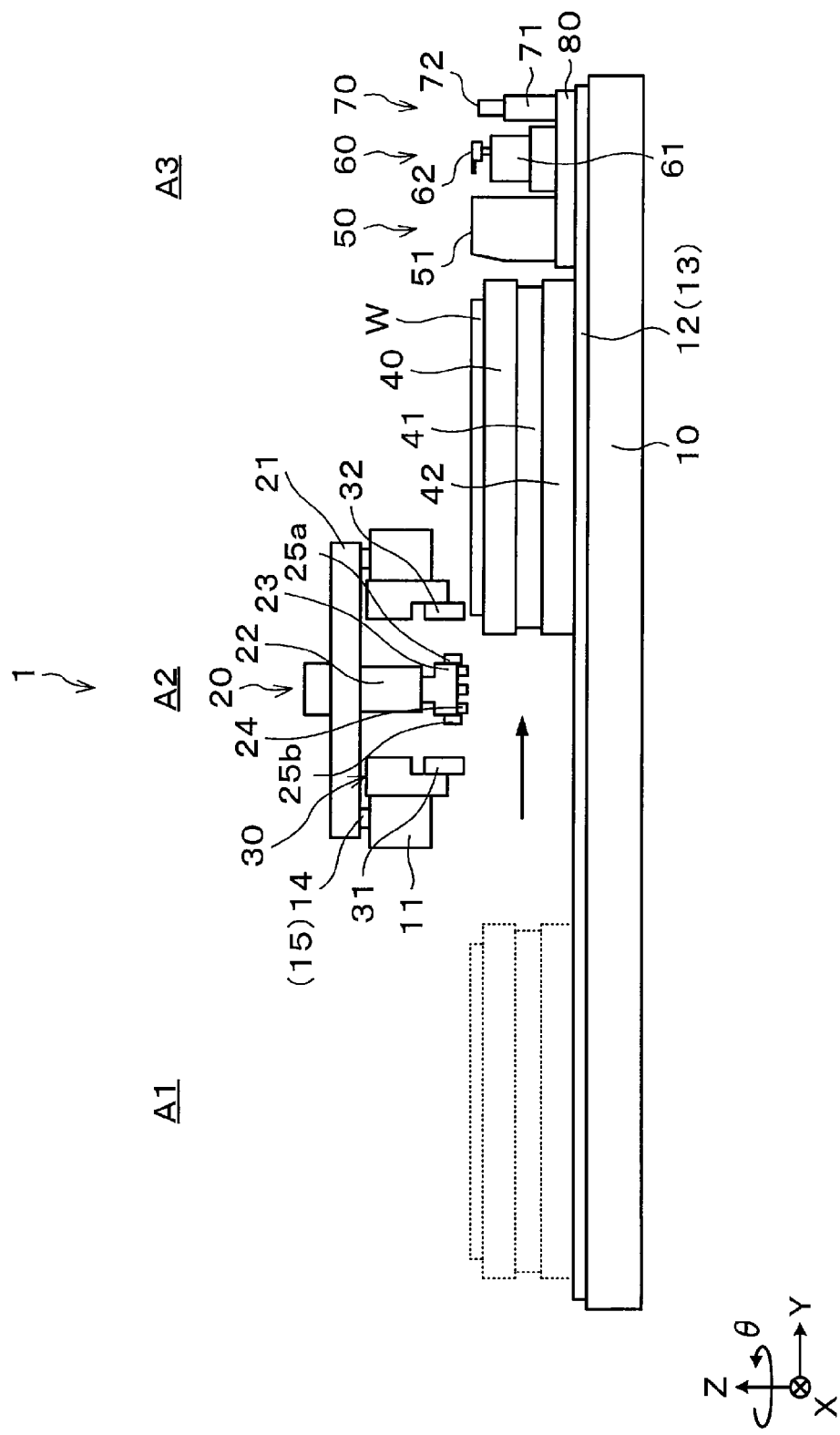
FIG. 5 is an explanatory view illustrating, in a side view, a state in which a workpiece is moved toward a droplet ejecting head.

A position adjustment workpiece W is used to adjust a landing position of a droplet onto the workpiece W from the droplet ejecting head 24 when the droplet ejecting apparatus 1 starts up, and the reference positions of the carriage marks 25a and 25b are acquired when the landing position is adjusted. Specifically, as illustrated in FIG. 5, the workpiece table 40 on which the workpiece W is placed is moved by the Y-axis linear motors 13 from the loading and unloading area A1 to the standby area A3. In this case, in the processing area A2, a droplet is ejected from the droplet ejecting head 24 onto the workpiece W moved to the position under the droplet ejecting head 24, and then the second image capturing unit 32 captures an image of the droplet landing on an upper surface of the workpiece W by capturing an image of the workpiece W.

Based on the captured image acquired by the second image capturing unit 32, the control unit 150 measures the landing position of the droplet on the workpiece W and calculates the positional deviation amount between the measured landing position and a target position. Based on the positional deviation amount, for example, the droplet ejecting timing of the droplet ejecting head 24 is corrected, and the relative movement of the workpiece table 40 and the droplet ejecting head in the main scanning direction and the sub-scanning direction is corrected. Hereinafter, the correction, which is performed when the droplet ejecting apparatus 1 starts up, is referred to as automatic correction in some instances.

After the automatic correction is performed, the position detector 72 is moved by the Y-axis linear motors 13 to the position directly under the carriage 23 and captures an image of the carriage 23. Further, based on the acquired captured image (FIG. 4), the position detector 72 acquires the reference positions of the carriage marks 25a and 25b of the carriage 23.

Next, the positions of the carriage marks 25a and 25b are detected when maintenance is performed on the droplet ejecting head 24 during a normal operation (step S2). As described below, the maintenance is performed on the droplet ejecting head 24 each time a pattern is drawn on the workpiece W.

Figure 6:
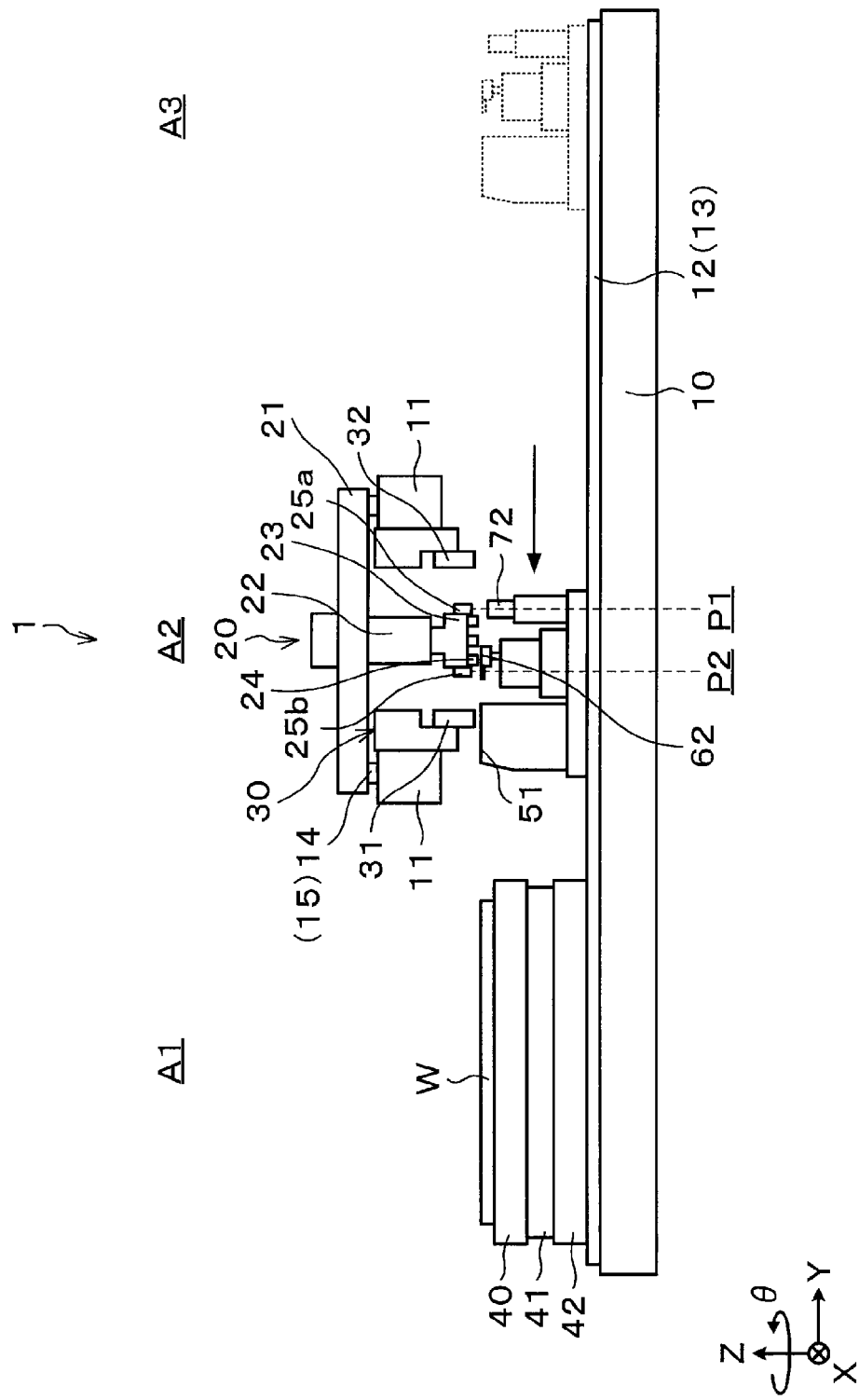
FIG. 6 is an explanatory view illustrating, in a side view, a state in which an image capturing unit captures an image of a first carriage mark at a first image capturing position.
Figure 7:
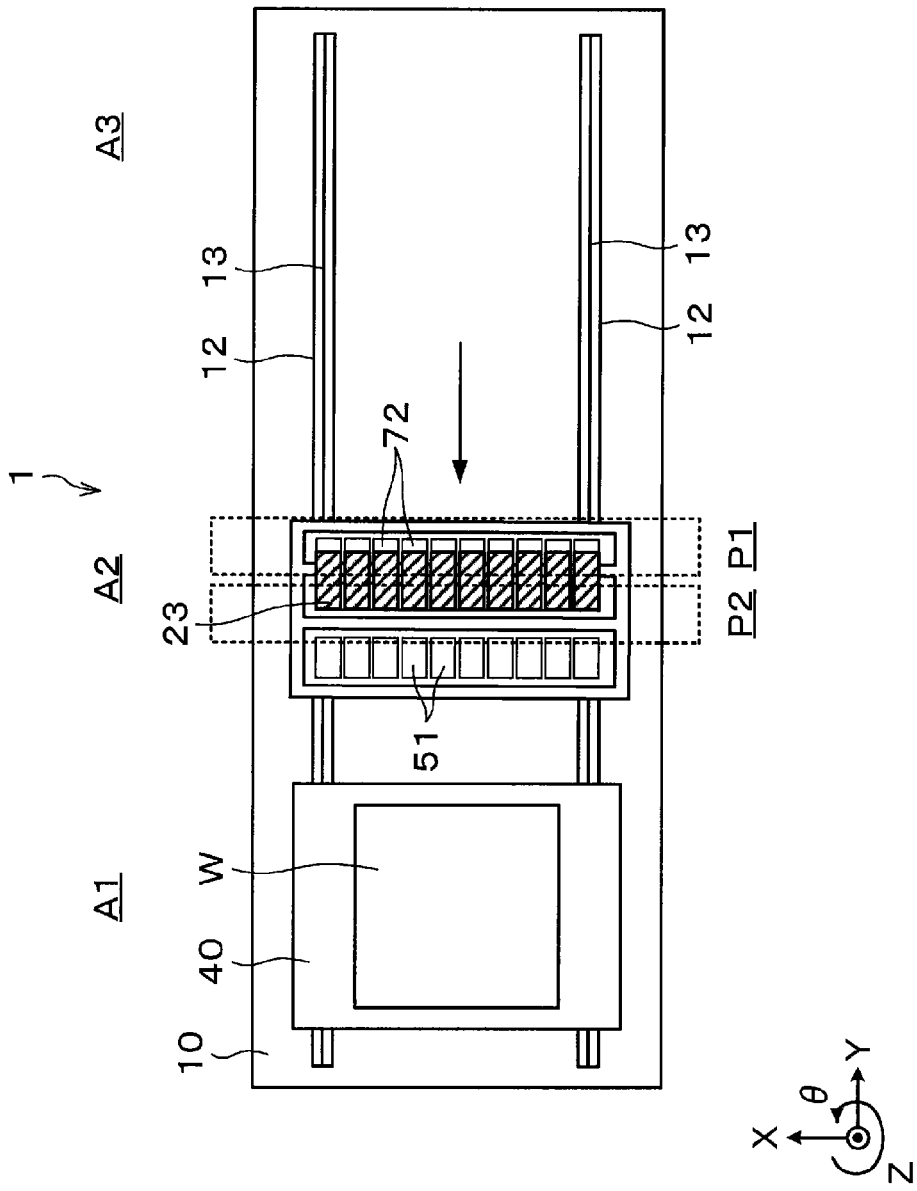
FIG. 7 is an explanatory view illustrating, in a plan view, a state in which the image capturing unit captures an image of the first carriage mark at the first image capturing position.
Figure 8:
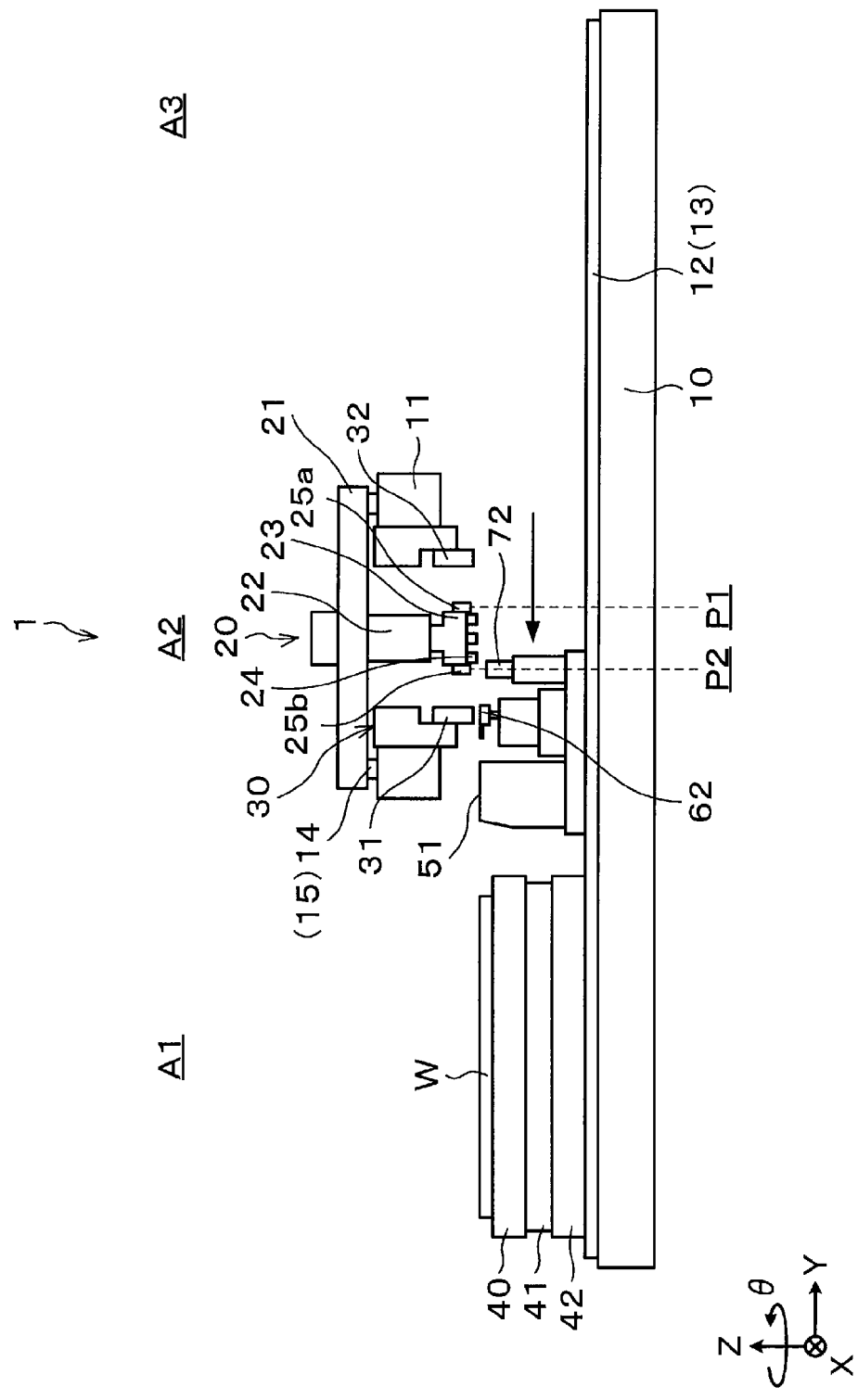
FIG. 8 is an explanatory view illustrating, in a side view, a state in which the image capturing unit captures an image of a second carriage mark at a second image capturing position.
Figure 9:
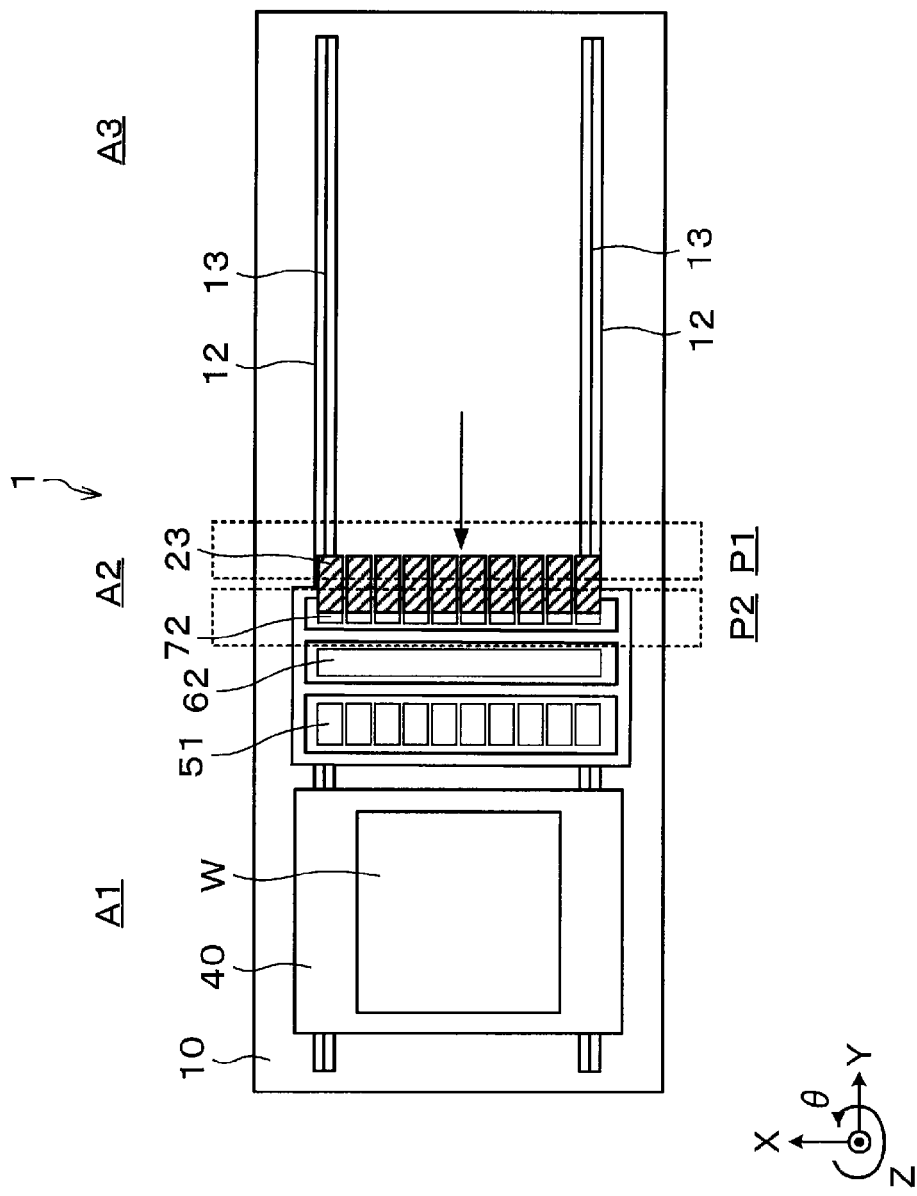
FIG. 9 is an explanatory view illustrating, in a plan view, a state in which the image capturing unit captures an image of the second carriage mark at the second image capturing position.

Specifically, as illustrated in FIGS. 6 and 7, the position detector 72 is moved by the Y-axis linear motors 13 to the position (first image capturing position P1) directly under the first carriage mark 25a, and an image of the first carriage mark 25a is captured by the position detector 72. Next, as illustrated in FIGS. 8 and 9, the position detector 72 is moved by the Y-axis linear motors 13 to the position (second image capturing position P2) directly under the second carriage mark 25b, and an image of the second carriage mark 25b is captured by the position detector 72. In this case, the position detector 72 and the carriage 23 correspond to each other one by one, and images of the corresponding carriages 23 are captured by the respective position detectors 72. Further, the images may be captured by the position detector 72 at the image capturing positions P1 and P2 in a state in which the position detector 72 is stopped or while the position detector 72 is moved in the Y-axis direction.

Figure 10:
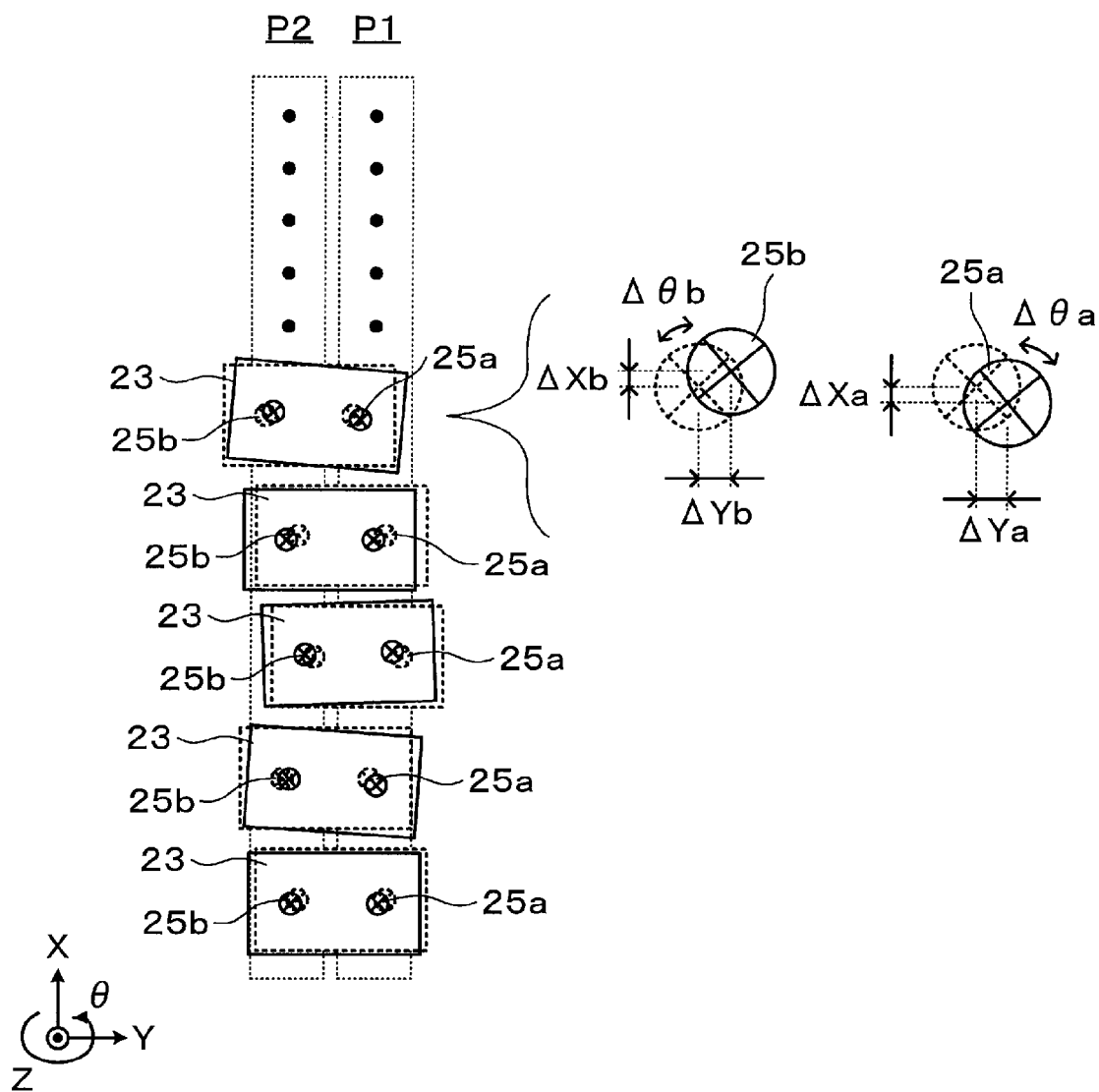
FIG. 10 is an explanatory view illustrating a detection position (solid line) of the carriage, which is detected by the image capturing unit, together with the reference position (dotted line) of the carriage.

FIG. 10 illustrates the detection positions (solid lines) of the carriage marks 25a and 25b detected by the position detector 72 together with the reference positions (dotted lines) of the carriage marks 25a and 25b. The control unit 150 calculates the positional deviation amount ΔYa in the Y-axis direction, the positional deviation amount ΔXa in the X-axis direction, and the positional deviation amount Δθa in the θ direction between the detection position and the reference position in respect to the first carriage mark 25a of one carriage 23. In addition, the control unit 150 calculates the positional deviation amount ΔYb in the Y-axis direction, the positional deviation amount ΔXb in the X-axis direction, and the positional deviation amount Δθb in the θ direction between the detection position and the reference position in respect to the second carriage mark 25b.

Based on the positional deviation amounts ΔYa and ΔYb in the Y-axis direction, the control unit 150 calculates a correction amount of the droplet ejecting timing of the droplet ejecting head 24 (step S3). The calculated correction amount is output to a motion controller (not illustrated) for controlling the droplet ejecting timing, and the droplet ejecting timing of the droplet ejecting head 24 is corrected.

In step S3, based on the positional deviation amounts ΔXa and ΔXb in the X-axis direction and the positional deviation amounts Δθa and Δθb in the θ direction, the control unit 150 calculates the positional correction amounts of the carriage 23 in the X-axis direction and the θ direction. The calculated correction amounts are output to the carriage 23, and the positions of the carriage 23 in the X-axis direction and the θ direction are corrected.

<Processing on Workpiece in Droplet Ejecting Apparatus>

Next, processing on the workpiece performed using the droplet ejecting apparatus 1 configured as described above will be described.

First, the workpiece table 40 is disposed in the loading and unloading area A1, and the workpiece W, which is loaded into the droplet ejecting apparatus 1 by a transport mechanism (not illustrated), is placed on the workpiece table 40. Next, an image of an alignment mark of the workpiece W placed on the workpiece table 40 is captured by the workpiece alignment camera. Further, based on the captured image, the positions of the workpiece W, which is placed on the workpiece table 40, in the X-axis direction and the θ direction are corrected by the table movement mechanism 41, such that the workpiece W is aligned (step T1).

Thereafter, the workpiece table 40 is moved by the Y-axis linear motors 13 from the loading and unloading area A1 to the processing area A2. In the processing area A2, the droplets are ejected from the droplet ejecting head 24 onto the workpiece W which is moved to the position under the droplet ejecting head 24. Further, as illustrated in FIG. 5, the workpiece table 40 is further moved to the standby area A3 so that the entire surface of the workpiece W passes below the droplet ejecting head 24. Further, the workpiece W is reciprocally moved in the Y-axis direction and moved appropriately in the X-axis direction, such that a predetermined pattern is drawn on the workpiece W (step T2).

Thereafter, the workpiece table 40 is moved from the standby area A3 to the loading and unloading area A1. The second image capturing unit 32 captures an image of the entire surface of the workpiece W placed on the workpiece table 40, that is, captures an image indicating a state in which a pattern is drawn by the droplets ejected onto the workpiece W while the workpiece table 40 is moved. The captured image is output to the control unit 150, and based on the captured image, the control unit 150 performs an inspection in respect to a defect of a drawing state, for example, film irregularity or the like. As a result of the inspection, when it is determined that the drawing state is defective, the movement of the workpiece table 40 in the Y-axis direction is corrected or the positions of the workpiece table 40 in the X-axis direction and the θ direction are corrected, for example (step T3).

When the workpiece table 40 is moved to the loading and unloading area A1, the workpiece W on which the drawing processing is completed is unloaded from the droplet ejecting apparatus 1. Subsequently, a next workpiece W is loaded into the droplet ejecting apparatus 1, and the workpiece W is aligned in accordance with the aforementioned step T1 (step T4).

The flushing unit 50, the ejecting inspection unit 60, and the second image capturing section 70 are moved by the Y-axis linear motors 13 from the standby area A3 to the processing area A2 while the inspection in respect to the drawing state is performed in step T3 and the loading and unloading of the workpiece W is performed in step T4. In the processing area A2, the inspection sheet 62 of the ejecting inspection unit 60 is disposed under the droplet ejecting head 24, and the droplet is ejected from the droplet ejecting head 24 onto the inspection sheet 62 for inspection (step T5).

Thereafter, the flushing unit 50 and the ejecting inspection unit 60 are moved to the positive side in the X-axis direction, such that the inspection sheet 62 of the ejecting inspection unit 60 is disposed under the first image capturing unit 31, and the flushing recovery table 51 of the flushing unit 50 is disposed under the droplet ejecting head 24.

The first image capturing unit 31 captures an image of a landed dot of the droplets ejected onto the inspection sheet 62 for inspection. The captured image is output to the control unit 150, and based on the captured image, the control unit 150 detects an ejecting defect of the ejecting nozzle of the droplet ejecting head 24. Based on the result of the inspection, appropriate maintenance is performed on the droplet ejecting head 24.

A discarded droplet is ejected from the droplet ejecting head 24 onto the flushing recovery table 51 while the image capturing process is performed by the first image capturing unit 31 and the ejecting defect inspection is performed by the control unit 150 (step T6).

The aforementioned steps S1 to S3 are performed when the ejection for inspection is performed in step T5 and the flushing is performed in step T6, such that the position detector 72 detects the positions of the carriage marks 25a and 25b based on the captured image, and the control unit 150 corrects the droplet ejecting timing of the droplet ejecting head 24 and corrects the positions of the carriage 23 (droplet ejecting head 24) in the X-axis direction and the θ direction based on the positional deviation amounts between the detection positions and the reference positions of the carriage marks 25a and 25b (step T7).

Steps T1 to T7 are performed on the respective workpieces as described above, and then a series of processing on the workpieces ends.

According to the exemplary embodiment, even if positional deviation of the carriage 23 occurs due to factors, for example, such as a change in temperature and a change with time of the carriage 23, after the automatic correction is performed by the droplet ejecting apparatus 1, it is possible to correct the droplet ejecting timing of the droplet ejecting head 24 and correct the positions of the carriage 23 (droplet ejecting head 24) in the X-axis direction and the θ direction by performing the aforementioned steps S1 to S3. Therefore, it is possible to appropriately eject the droplet onto the workpiece W from the droplet ejecting head 24 and improve precision in ejecting (precision in landing) the droplet onto the workpiece W from the droplet ejecting head 24.

In steps T5 and T6, the maintenance of the droplet ejecting head 24 is performed for each sheet of workpiece W, and as a result, in step T7, the droplet ejecting timing and the position of the carriage 23 may also be corrected for each sheet of workpiece W. Therefore, it is possible to further improve precision in landing the droplet on the workpiece W from the droplet ejecting head 24.

The position detector 72 is provided to correspond to the carriage 23 one by one such that the position detector 72 may be disposed at an appropriate position with respect to the carriage 23 and may capture an image with high precision. In addition, images of the plurality of carriages 23 may be captured at a time using a plurality of position detectors 72, and as a result, it is possible to reduce time required to capture the images. Further, the position detector 72 may capture an image while moving in the Y-axis direction, and in this case, it is possible to further reduce time required to capture the image.

In the aforementioned exemplary embodiment, the position detectors 72 of the second image capturing section 70 are provided in a single row in the Y-axis direction, but may be provided in two rows. In this case, the image capturing operation of the position detector 72 at the first image capturing position P1 and the image capturing operation of the position detector 72 at the second image capturing position P2 may be simultaneously performed. Therefore, the image capturing time may be further reduced.

In the aforementioned exemplary embodiment, the position detector 72 captures the images of the carriage marks 25a and 25b, but images of the carriage 23 at other positions may be captured. For example, another reference mark may be formed on the carriage 23 and an image of the reference mark may be captured, or an image of a particular nozzle of the droplet ejecting head 24 may be captured as an image of the reference mark.

In the aforementioned exemplary embodiment, the droplet ejecting timing of the droplet ejecting head 24 and the positions of the carriage 23 (droplet ejecting head 24) in the X-axis direction and the θ direction are corrected using the captured images at the first image capturing position P1 and the second image capturing position P2. However, in an actual operation, it does not have to acquire the captured images at both of the first image capturing position P1 and the second image capturing position P2.

For example, only the captured image of the first carriage mark 25a may be acquired by capturing an image of the carriage 23 at the first image capturing position P1 by the position detector 72. Further, based on the captured image, the position of the first carriage mark 25a is detected, and at least the positional deviation amount in the Y-axis direction between the detection position and the reference position of the first carriage mark 25a is calculated such that only the droplet ejecting timing of the droplet ejecting head 24 is corrected. In this case, it is possible to correct at least the positional deviation in the Y-axis direction which requires high landing precision.

The captured images at both of the first image capturing position P1 and the second image capturing position P2 may be acquired with a predetermined timing, or for example, the captured images may be acquired at the time of the cleaning of the droplet ejecting head 24, which is performed with a predetermined frequency. In this case, the droplet ejecting timing of the droplet ejecting head 24 may be corrected, and the positions of the carriage 23 (droplet ejecting head 24) in the X-axis direction and the θ direction may be corrected.

Another Exemplary Embodiment

Next, another exemplary embodiment of the present disclosure will be described.

Figure 11:
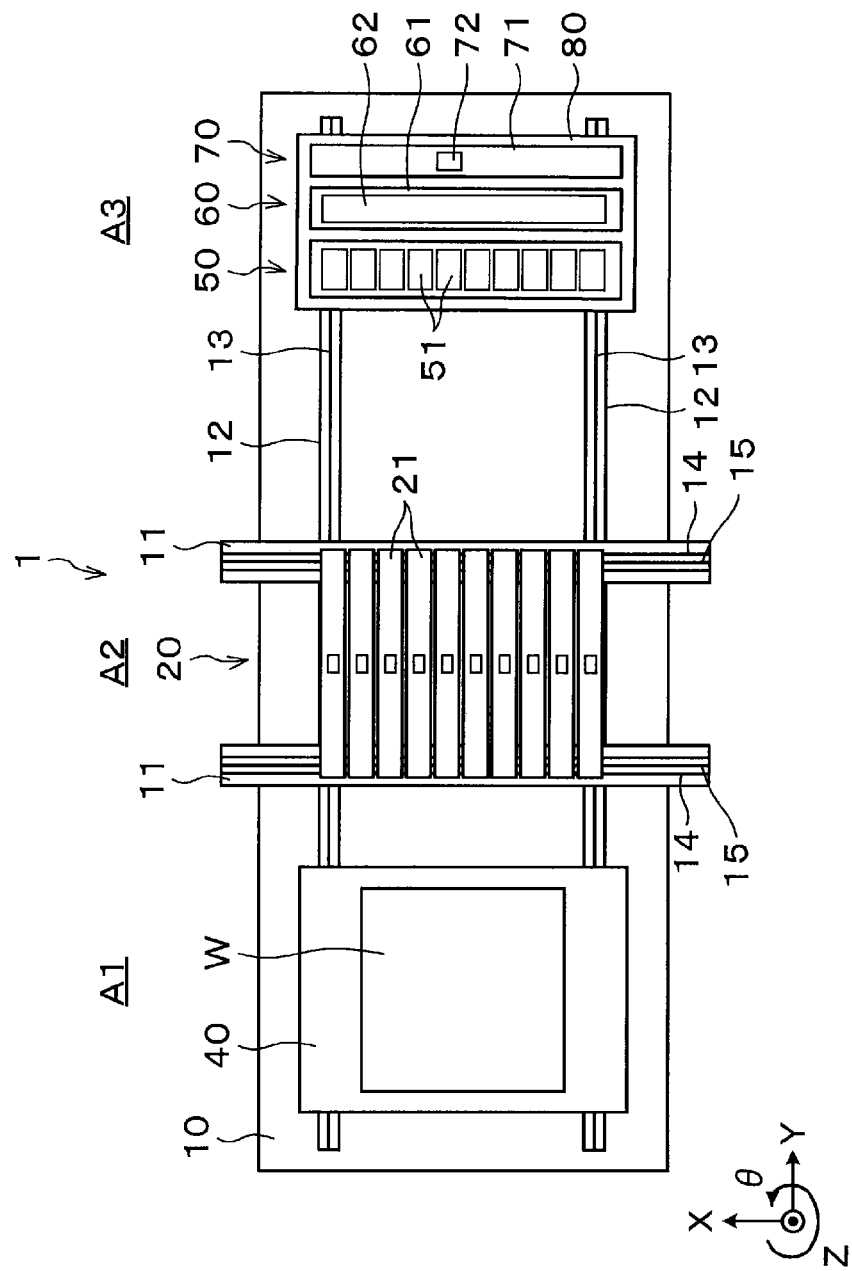
FIG. 11 is a top plan view illustrating an outline of a configuration of a droplet ejecting apparatus according to another exemplary embodiment.

In the aforementioned exemplary embodiment, the position detectors 72 and the carriages 23 are provided side by side in the X-axis direction, and the number of position detectors 72 and the number of carriages 23 are equal to each other, but as illustrated in FIG. 11, a single position detector 72 may be provided. In this case, the position detector 72 is configured to be movable in the X-axis direction along the base 71. A mechanism for moving the position detector 72 is not particularly limited, but an actuator, which has, for example, a scanning axis in the X-axis direction, is used as the mechanism.

Figure 12:
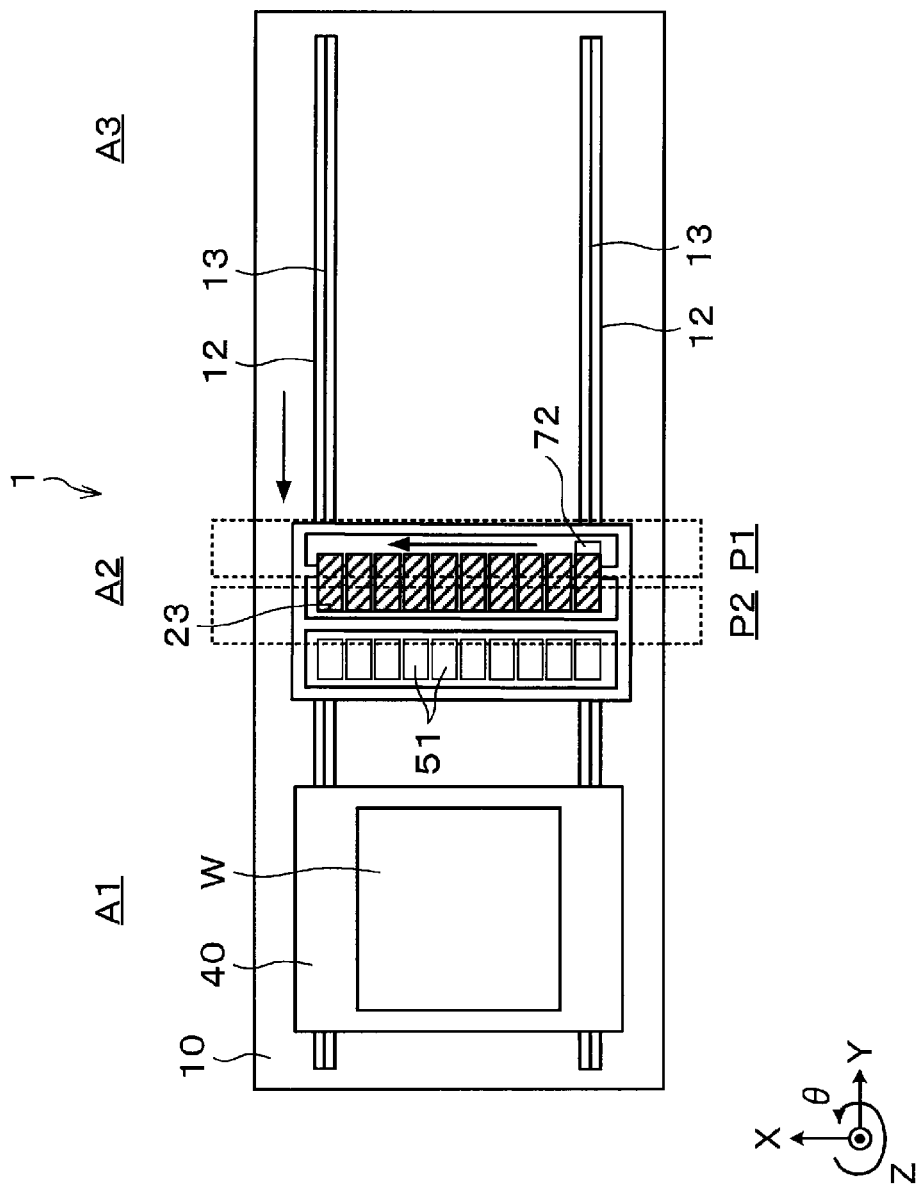
FIG. 12 is an explanatory view illustrating, in a plan view, a state in which an image capturing unit captures an image of a first carriage mark at a first image capturing position in accordance with another exemplary embodiment.
Figure 13:
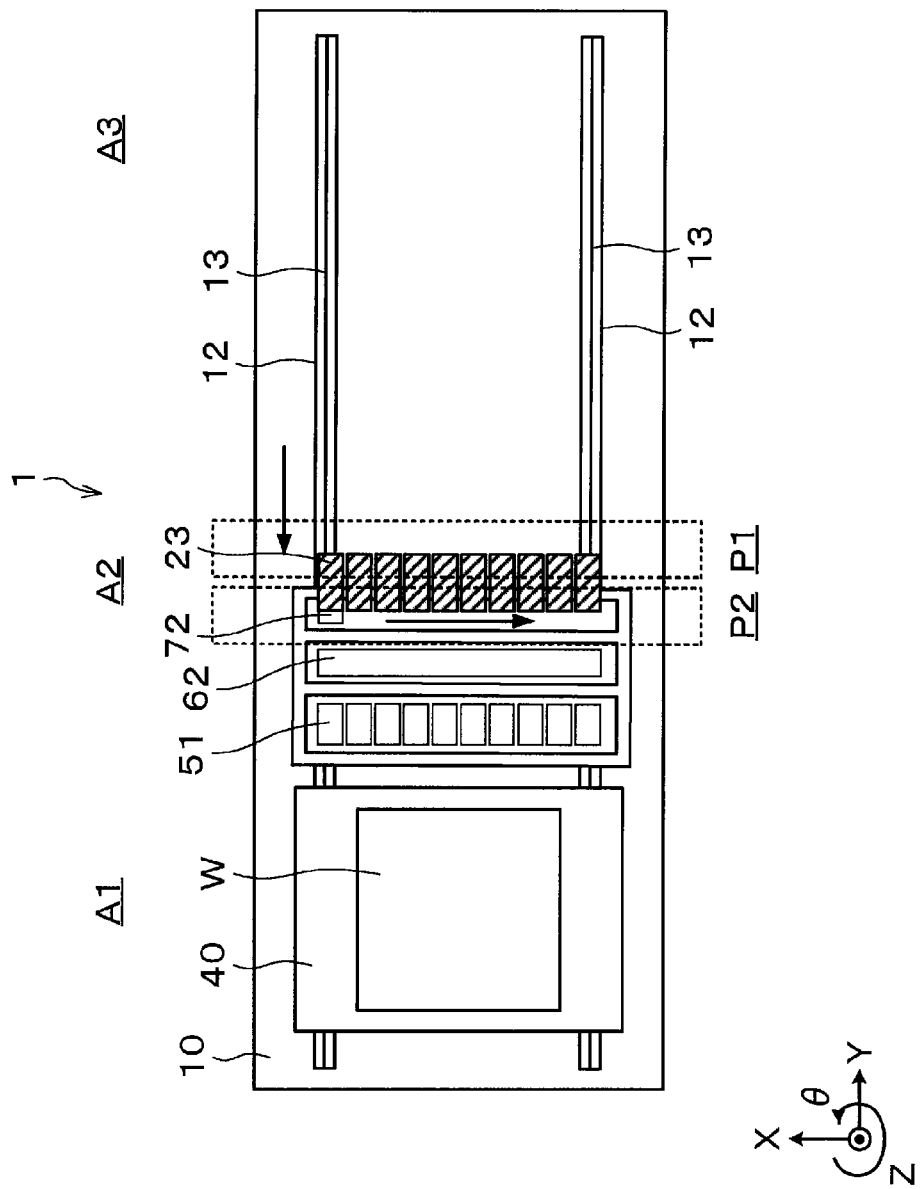
FIG. 13 is an explanatory view illustrating, in a plan view, a state in which the image capturing unit captures an image of a second carriage mark at a second image capturing position in accordance with another exemplary embodiment.

In this case, in step S2, as illustrated in FIG. 12, the position detector 72 is moved in the X-axis direction in a state in which the Y-axis linear motors 13 are stopped at the first image capturing position P1. Further, at the first image capturing position P1, images of the plurality of carriages 23 (first carriage marks 25a) are captured. Next, as illustrated in FIG. 13, even at the second image capturing position P2, the position detector 72 is moved in the X-axis direction in a state in which the Y-axis linear motors 13 are stopped. Further, at the second image capturing position P2, images of the plurality of carriages 23 (second carriage marks 25b) are captured. Further, the other steps S1 and S3 are identical to steps S1 and S3 in the aforementioned exemplary embodiment, respectively.

Even in the present exemplary embodiment, it is possible to obtain an effect identical to the effect of the aforementioned exemplary embodiment. That is, the droplet ejecting timing of the droplet ejecting head 24 may be corrected, and the positions of the carriage 23 (droplet ejecting head 24) in the X-axis direction and the 0 direction may be corrected. As a result, it is possible to improve precision in landing the droplet on the workpiece W from the droplet ejecting head 24. In addition, the plurality of position detectors 72 are not required, and as a result, it is possible to simplify the configuration of the second image capturing section 70.

In the aforementioned exemplary embodiment, the position detector 72 is provided on the second Y-axis slider 80, but may be provided on the workpiece table 40. Even in this case, the droplet ejecting timing of the droplet ejecting head 24 may be corrected, and the positions of the carriage 23 (droplet ejecting head 24) in the X-axis direction and the θ direction may be corrected by performing the aforementioned steps S1 to S3. Further, the position detectors 72 may be provided such that the number of position detectors 72 is equal to the number of carriages 23 as in the case illustrated in FIG. 2, or the position detector 72 may be configured to be movable in the X-axis direction as in the case illustrated in FIG. 11.

The position detector 72 may be provided on the carriage 23. In this case, the position detector 72 may, for example, detect the positions of the carriage 23 (droplet ejecting head 24) by capturing an image of the reference mark formed on the workpiece table 40, the flushing unit 50, or the ejecting inspection unit 60. Further, the position detectors 72 may be provided such that the number of position detectors 72 is equal to the number of carriages 23 as in the case illustrated in FIG. 2, or the position detector 72 may be configured to be movable in the X-axis direction as in the case illustrated in FIG. 11.

In the aforementioned exemplary embodiment, the positions of the carriage marks 25a and 25b of the carriage 23 are detected by the position detector 72, but the means for detecting the positions is not limited thereto. For example, a laser interferometer (not illustrated) or a laser displacement meter (not illustrated) may be used to detect the positions of the carriage marks 25a and 25b.

In the aforementioned exemplary embodiment, the workpiece table 40 is moved in the Y-axis direction using the Y-axis linear motors 13 (first Y-axis slider 42) and the table movement mechanism 41 as the workpiece movement mechanism, but the droplet ejecting head 24 may be moved in the Y-axis direction. In addition, both of the workpiece table 40 and the droplet ejecting head 24 may be moved in the Y-axis direction. In addition, the workpiece table 40 is moved in the X-axis direction such that a line break is performed, but the droplet ejecting head 24 may be moved in the X-axis direction. The X-axis linear motor 15 may be used in the case in which the droplet ejecting head 24 is moved in the X-axis direction.

In the aforementioned exemplary embodiment, the flushing unit 50, the ejecting inspection unit 60, and the second image capturing section 70 are moved in the Y-axis direction using the Y-axis linear motors 13 (second Y-axis slider 80) as the unit movement mechanism, but the carriage 23 (droplet ejecting head 24) may be moved in the Y-axis direction. In addition, both of the droplet ejecting head 24 and the flushing unit 50, the ejecting inspection unit 60, and the second image capturing section 70 may be moved in the Y-axis direction.

<Application Example of Droplet Ejecting Apparatus>

The droplet ejecting apparatus 1 configured as described above is applied to, for example, a substrate processing system for forming an organic EL layer of an organic light emitting diode which is disclosed in Japanese Patent Application Laid-Open No. 2017-13011. Specifically, the droplet ejecting apparatus 1 is applied to a coating apparatus for applying an organic material for forming a hole injection layer on a glass substrate as the workpiece W, a coating apparatus for applying an organic material for forming a hole transport layer on a glass substrate (hole injection layer), and a coating apparatus for applying an organic material for forming a light emitting layer on a glass substrate (hole transport layer). Further, in a case in which the substrate processing system also forms an electron transport layer and an electron injection layer in addition to forming the hole injection layer, the hole transport layer, and the light emitting layer of the organic light emitting diode, the droplet ejecting apparatus 1 may also be applied to the coating process of forming the electron transport layer and the electron injection layer.

The droplet ejecting apparatus 1 may be applied to form the organic EL layer of the organic light emitting diode as described above, and may be applied to electro-optical devices (flat panel displays (FPD)) such as color filters, liquid crystal display devices, plasma displays (PDP devices), electron emitting devices (FED devices or SED devices), or may be applied to forming metal wiring, lenses, resist, light diffusion bodies, and the like.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A droplet ejecting apparatus comprising:
  a workpiece table configured to receive a workpiece;
  a carriage including a plurality of pairs of droplet ejecting heads which includes a first pair of droplet ejecting heads provided side by side to a second pair of droplet electing heads in a main scanning direction, the main scanning direction being orthogonal to a sub-scanning direction, and a plurality of carriage marks which includes a first carriage mark and a second carriage mark, said first carriage mark and said second carriage mark being disposed on a lower surface of the carriage at opposite ends of the carriage and arranged along a centerline of the carriage in the main scanning direction, each droplet ejecting head including a nozzle surface configured to eject droplets of a functional liquid onto the workpiece placed on the workpiece table so as to draw a pattern;
  a workpiece mover configured to move the workpiece table in the main scanning direction relative to the carriage;
  a position detector including a camera configured to detect a position of the first pair of droplet ejecting heads by capturing an image of the first carriage mark and the second carriage mark of the first pair of droplet ejecting heads;
  a scanning direction slider configured to move the camera relative to the carriage in the main scanning direction; and
  a controller configured to:
    perform a first movement of the camera in the main scanning direction using the scanning direction slider to a first image capturing position directly under the first carriage mark to detect a position of the first carriage mark;
    perform a second movement of the camera in the main scanning direction using the scanning direction slider to a second image capturing position directly under the second carriage mark to detect a position of the second carriage mark;
    calculate positional deviation amounts in the main scanning direction between the position of the first carriage mark detected by the camera in the first movement and a reference position of the first carriage mark, and between the position of the second carriage mark detected by the camera in the second movement of the camera and a reference position of the second carriage mark; and
    correct a droplet ejection timing of the plurality of droplet ejecting heads based on the positional deviation amounts,
  wherein the plurality of pairs of the droplet ejecting heads are arranged such that nozzle surfaces of each pair of the plurality of pairs of droplet ejecting heads are symmetrically arranged on opposite sides of the centerline of the carriage.

2. The droplet ejecting apparatus of claim 1, further comprising:
  a droplet ejecting head mover configured to move the droplet ejecting heads in a rotation direction and a sub-scanning direction orthogonal to the main scanning direction,
  wherein the plurality of carriage marks are positioned side by side in the main scanning direction to correspond to the position of the droplet ejecting head.

3. The droplet ejecting apparatus of claim 2, wherein the controller is further configured to:

calculate the positional deviation amounts in the sub-scanning direction and the rotation direction between the position of the first carriage mark detected by the position detector and the reference position of the first carriage mark and between the position of the second carriage mark detected by the position detector and the reference position of the second carriage mark; and correct positions of the plurality of pairs of droplet ejecting heads in the sub-scanning direction and the rotation direction based on the positional deviation amounts in the sub-scanning direction and the rotation direction.

4. The droplet ejecting apparatus of claim 1, further comprising:
a flusher and an ejection inspector configured to perform maintenance of the plurality of pairs droplet ejecting heads,
wherein the scanning direction slider is configured to move the flusher and the ejection inspector relative to the plurality of pairs droplet ejecting heads in the main scanning direction, and
the position detector is provided on the scanning direction slider.

5. The droplet ejecting apparatus of claim 1, wherein a plurality of position detectors are provided at positions corresponding to the plurality of pairs of droplet ejecting heads.

6. The droplet ejecting apparatus of claim 1, wherein the position detector is configured to be movable in the sub-scanning direction.

7. A droplet ejecting method comprising:
providing a workpiece table configured to receive a workpiece;
providing a carriage including a plurality of pairs of droplet ejecting heads which includes a first pair of droplet ejecting heads provided side by side to a second pair of droplet ejecting heads in a main scanning direction, the main scanning direction being orthogonal to a sub-scanning direction, and a plurality of carriage marks which includes a first carriage mark and a second carriage mark, the first carriage mark and the second carriage mark being disposed on a lower surface of the carriage at opposite ends of the carriage and arranged along a centerline of the carriage in the main scanning direction, each droplet ejecting head including a nozzle surface configured to eject droplets of a functional liquid onto the workpiece placed on the workpiece table so as to draw a pattern;
providing a workpiece mover configured to move the workpiece table in the main scanning direction relative to the carriage;
detecting, with a position detector including a camera a position of the first pair of droplet ejecting heads by capturing an image of the first carriage mark and an image of the second carriage mark of the first pair of droplet ejecting heads;
providing a scanning direction slider configured to move the camera relative to the carriage in the main scanning direction;
providing a controller configured to: calculate a positional deviation amount in the main scanning direction between the position of the first pair of droplet ejecting heads detected by the position detector and a reference position of the first pair of droplet ejecting heads and correct a droplet ejection timing of the first pair of droplet ejecting heads based on the positional deviation amount;

performing a first movement of the camera in the main scanning direction using the scanning direction slider to a first image capture position under the first carriage mark to detect a position of the first carriage mark;
performing a second movement of the camera in the main scanning direction using the scanning direction slider to a second image capturing position directly under the second carriage mark to detect a position of the second carriage mark;
calculating with the controller positional deviation amounts in the main scanning direction between the position of the first carriage mark detected by the camera in the first moving and a reference position of the first carriage mark, and between the position of the second carriage mark detected by the camera in the second moving and a reference position of the second carriage mark; and
correcting with the controller the droplet ejection timing of the first pair of droplet ejecting heads based on the positional deviation amounts,
wherein the plurality of pairs of the droplet ejecting heads are arranged such that nozzle surfaces of each pair of the plurality of pairs of droplet ejecting heads are symmetrically arranged on opposite sides of the centerline of the carriage.

8. The droplet ejecting method of claim 7, wherein the calculating step includes:
calculating positional deviation amounts in a sub-scanning direction orthogonal to the main scanning direction and positional deviation amounts in a rotation direction between the position of the first carriage mark and the reference position of the first carriage mark, and the positional deviation amounts in the sub-scanning direction and the positional deviation amounts in the rotation direction between the position of the second carriage mark and the reference position of the second carriage mark; and
correcting positions of the plurality of pairs of droplet ejecting heads in the sub-scanning direction and the rotation direction based on the positional deviation amounts in the sub-scanning direction and the positional deviation amounts in the rotation direction.

9. The droplet ejecting method of claim 7, further comprising:
performing the calculating step before the droplets are ejected onto the workpiece and performing maintenance of the plurality of pairs of droplet ejecting heads using a flusher and an ejection inspector, and
providing the position detector on a scanning direction slider, the scanning direction slider being configured to move the flusher and the ejection inspector relative to the carriage in the main scanning direction.

10. The droplet ejecting method of claim 7, further comprising: providing a plurality of position detectors in the sub-scanning direction, and
in the detecting step, detecting with the plurality of position detectors positions of the plurality of pairs of droplet ejecting heads which correspond to the plurality of position detectors, respectively.

11. The droplet ejecting method of claim 7, wherein in the detecting step detecting with the position detector positions of the plurality of pairs of droplet ejecting heads while moving the position detector in the sub-scanning direction.

* * * * *